(12) United States Patent
Berger

(10) Patent No.: US 9,118,161 B2
(45) Date of Patent: Aug. 25, 2015

(54) LASER DIODE WITH INTERNAL AIR COOLING

(71) Applicant: Roland Berger, Eggstaett (DE)

(72) Inventor: Roland Berger, Eggstaett (DE)

( * ) Notice: Subject to any disclaimer, the term of this patent is extended or adjusted under 35 U.S.C. 154(b) by 0 days.

(21) Appl. No.: 14/382,607

(22) PCT Filed: Feb. 27, 2013

(86) PCT No.: PCT/DE2013/000100
§ 371 (c)(1),
(2) Date: Sep. 3, 2014

(87) PCT Pub. No.: WO2013/131504
PCT Pub. Date: Sep. 12, 2013

(65) Prior Publication Data
US 2015/0016481 A1    Jan. 15, 2015

(30) Foreign Application Priority Data
Mar. 7, 2012    (DE) .................. 10 2012 002 703

(51) Int. Cl.
| | |
|---|---|
| H01S 3/04 | (2006.01) |
| H01S 5/024 | (2006.01) |
| H01S 5/40 | (2006.01) |
| B82Y 20/00 | (2011.01) |
| H01S 5/10 | (2006.01) |
| H01S 5/00 | (2006.01) |
| H01S 5/068 | (2006.01) |
| H01S 5/34 | (2006.01) |
| H01S 5/022 | (2006.01) |

(52) U.S. Cl.
CPC .............. *H01S 5/024* (2013.01); *B82Y 20/00* (2013.01); *H01S 5/02407* (2013.01); *H01S 5/10* (2013.01); *H01S 5/4031* (2013.01); *H01S 5/005* (2013.01); *H01S 5/0224* (2013.01); *H01S 5/0243* (2013.01); *H01S 5/02264* (2013.01); *H01S 5/06825* (2013.01); *H01S 5/34* (2013.01)

(58) Field of Classification Search
USPC ...................... 372/34, 36, 43.01, 49.01, 50.1
See application file for complete search history.

(56) References Cited

U.S. PATENT DOCUMENTS

| | | | | |
|---|---|---|---|---|
| 6,072,814 | A | * | 6/2000 | Ryan et al. ...................... 372/35 |
| 2006/0186500 | A1 | * | 8/2006 | Stephens ....................... 257/433 |
| 2010/0074285 | A1 | * | 3/2010 | Stephens et al. ............... 372/34 |

FOREIGN PATENT DOCUMENTS

| | | |
|---|---|---|
| DE | 10033785 A1 | 1/2002 |
| DE | 10033786 A1 | 1/2002 |
| DE | 102008055746 A1 | 5/2010 |
| JP | H01278990 A | 11/1989 |
| JP | H08116138 A | 7/1996 |
| JP | 2000357835 A | 12/2000 |
| JP | 2002076500 A | 3/2002 |

* cited by examiner

*Primary Examiner* — Dung Nguyen
(74) *Attorney, Agent, or Firm* — Bacon & Thomas, PLLC

(57) ABSTRACT

The invention relates to a laser diode (2) comprising a plurality of individual emitters (EE) constructed on a substrate (8), said laser diode (2) comprising a housing which consists of a first contact part (13), a second contact part (15), an optical element (19*b*), a backplate (12) and two side pieces (11), with a plurality of first spacers (9*o*) being arranged between the substrate (8) and the first contact part (13) and a plurality of second spacers (9*u*) being arranged between the individual emitters (EE) and the second contact part (15). Incisions (17*a*) through which a cooling medium can flow are formed between each of the individual emitters (EE). The invention also relates to a device comprising at least one laser diode (2) of this type.

13 Claims, 3 Drawing Sheets

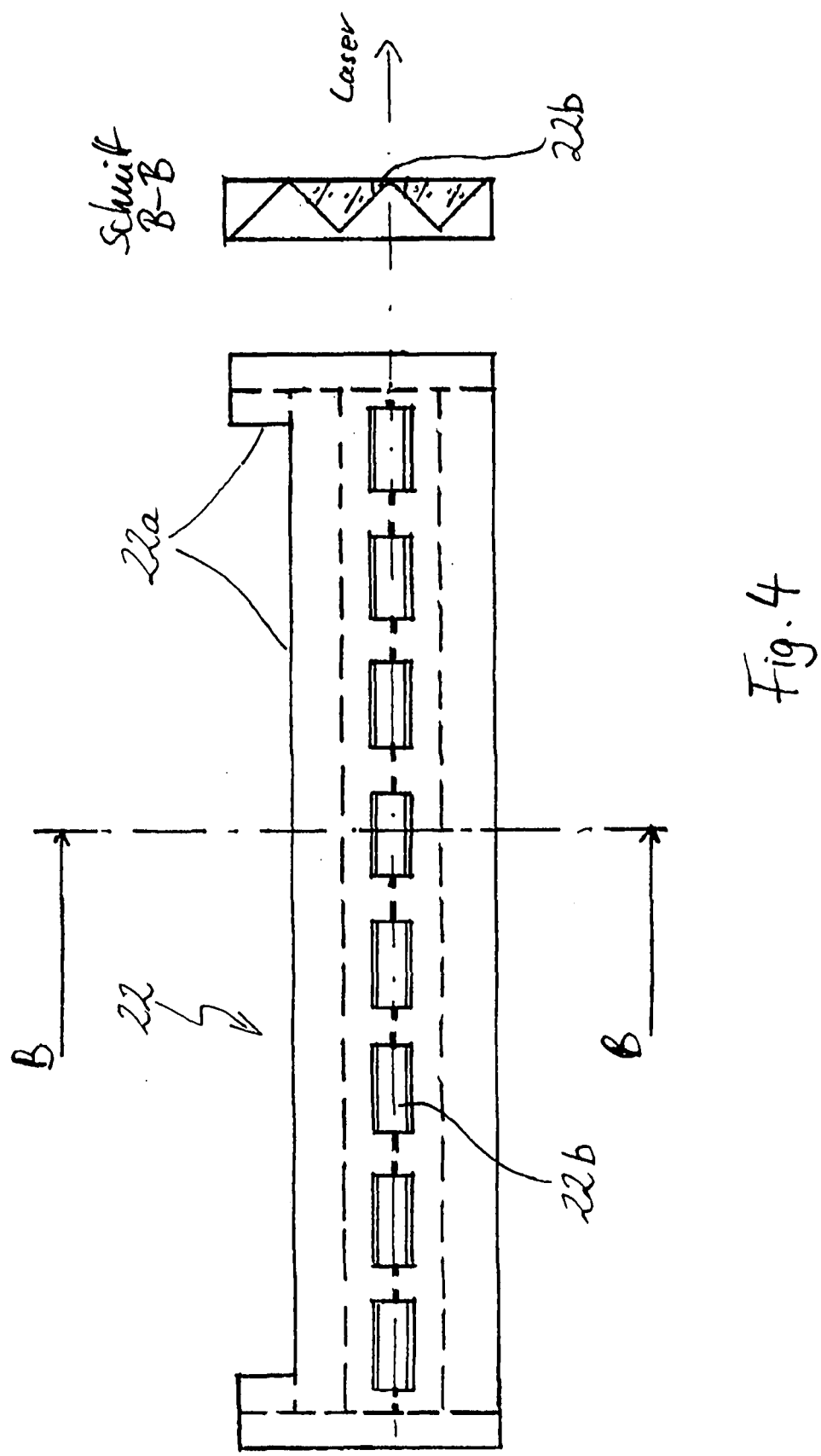

LASER DIODE WITH INTERNAL AIR COOLING

FIELD OF THE INVENTION

The present invention relates to a laser diode with internal air cooling.

PRIOR ART

Laser diodes are well known in prior art. A laser diode is a semiconductor element which generates laser radiation.

There are assemblies in which a plurality of laser diodes are arranged in such a manner that their optical output axes are parallel to one another and situated in one plane. This side-by-side assembly of laser diodes results in a so-called laser bar. Stacking several laser bars one above the other produces a laser stack. It goes without saying that laser diodes are not always combined to form bars or stacks; they are also available in the form of single-beam emitters.

In some cases, high-power fiber lasers additionally comprise a fiber laser or a laser diode which are referred to as seed lasers and serve for producing the input power for a downstream fiber amplifier (optically pumped, active fiber). Separating the laser in seed laser and downstream amplification offers the advantage that the laser operation has an improved controllability. This concerns the wavelength stability, the beam quality and the power stability as well as the pulsing ability. In most cases, an optical isolator is provided between the seed laser and the amplifier fiber.

US 2007/0291803 A1 describes a method and a device for cooling an assembly of several laser bars 14 comprising individual emitters 26 (see FIG. 9 and para.[0024]); said document also mentions cooling by means of a gaseous cooling medium (para. [0010]). Here, the laser bars 14 are cooled in indirect fashion by means of a spatial assembly of superimposed cooling elements which have a complex internal cooling channel configuration (FIGS. 1 to 6 and FIG. 10). The option of directly cooling the laser bars 14 in the sense of transporting a cooling medium through the bodies of the laser bars themselves is not mentioned in said reference.

JP 2008021899 shows an assembly made up of several semiconductor lasers 31 whose output energy is coupled into an optical waveguide in bundled form (FIGS. 2 and 3). There are miniaturized ventilators 20 as well as air guiding elements 40, 41, 42, which direct the cooling air to a cooling body 30 of the semiconductor laser 31, on the one hand, and into a cooling body 50, on the other hand, the latter serving for cooling the optical waveguide positioned on top of it. An internal cooling system of the semiconductor laser cannot be taken from said document.

FIG. 2 of U.S. Pat. No. 4,627,062 describes a laser stack made up of a plurality of laser diodes 5 which are arranged in groups in a sandwich-like structure (col. 5, line 6 ff.). The laser diodes 5 are each contacted by an electrode plate 19 which also acts as a heat conducting body. The electrode plate 19 transports the heat removed from the laser diode into a cooling plate 23.

FIG. 2 of WO 00/69034 A2 discloses a Nd-YAG laser which is pumped by at least two high-temperature laser diodes 24. Each of the two laser diodes 24 is equipped with a cooling body 26 which has to ensure a working temperature of the laser diodes of 70 to 80° C. in use (bridging paragraph pages 6/7). Here too, a person skilled in the art does not receive any suggestion in terms of internally cooling the laser diodes.

U.S. Pat. No. 6,480,515 B1 shows a laser diode 102 comprising a housing 104 which is arranged thereon and contains a cooling fluid 108. The output beam 110 of the laser diode traverses the fluid 108 and travels through an output window 118 of the housing. This is to create a heat removal possibility at the "hot" side of the laser diode, to be more precise the light outlet side.

US 2002/0018499 A1 describes a semiconductor laser element comprising a plurality of individual emitters which are built up in many layers 102 to 111 adjacent to a substrate 101 (FIG. 23 and para. [0192]). The semiconductor laser element shown here comprises a housing consisting of a first contact part 119 and a second contact part 122. Above the substrate 101 and partially within the substrate 101 (FIG. 18), there are cooling channels through which a cooling medium flows. The individual emitters are situated underneath said channels, but are not in direct contact with the cooling medium.

U.S. Pat. No. 6,396,854 B1 shows a semiconductor laser assembly which is cooled by means of a fluid-based cooling system and accommodated in a housing 31 (FIG. 2, Pos. 31). Said housing receives a one-time filling in the form of a cooling fluid 57 (FIG. 2, Pos. 57). The cooling fluid is also present between incisions 61 of the semiconductor laser assembly. A flow-based cooling is not provided in said device.

FIG. 2 of JP8116138 A discloses a laser diode comprising a housing 15 and a plurality of individual emitters 11, 12. Interspaces are provided between the individual emitters, and FIG. 1 shows flow arrows 7, 7' obviously representing the stream of a cooling medium.

DE 195 00 513 C1 describes an optical assembly for use in a laser diode array comprising a prism assembly (e.g. FIG. 1, Pos. 6/7) in front of an emitter group. The prism assembly consists of a first prism block 6 and a second prism block 7 which each are made up of several prism elements 6' and 7', respectively. A diaphragm effect of the two prism blocks is not evident.

It is the object of the invention to improve a laser diode such that internally cooling the laser diode is achieved by means of a gaseous cooling medium. This object is achieved by a laser diode comprising a plurality of individual emitters which are constructed on a substrate and each comprise an output mirror and a rear mirror, the laser diode comprising a housing which consists of a first contact part, a second contact part, an optical element, a backplate and two side pieces, a plurality of first spacers being arranged between the substrate and the first contact part and a plurality of second spacers being arranged between the individual emitters and the second contact part, incisions being made between the respective individual emitters and a cooling medium flowing through said incisions, and a prismatic aperture element being arranged in the area of the output mirror of the individual emitters.

Further advantageous embodiments will be apparent from the sub-claims depending thereon.

The invention will now be explained in more detail in the following description of a preferred embodiment with reference to the attached drawings in which:

FIG. 4 shows a prismatic aperture element of the laser diode according to the invention.

DETAILED DESCRIPTION OF THE INVENTION

Figure 1:
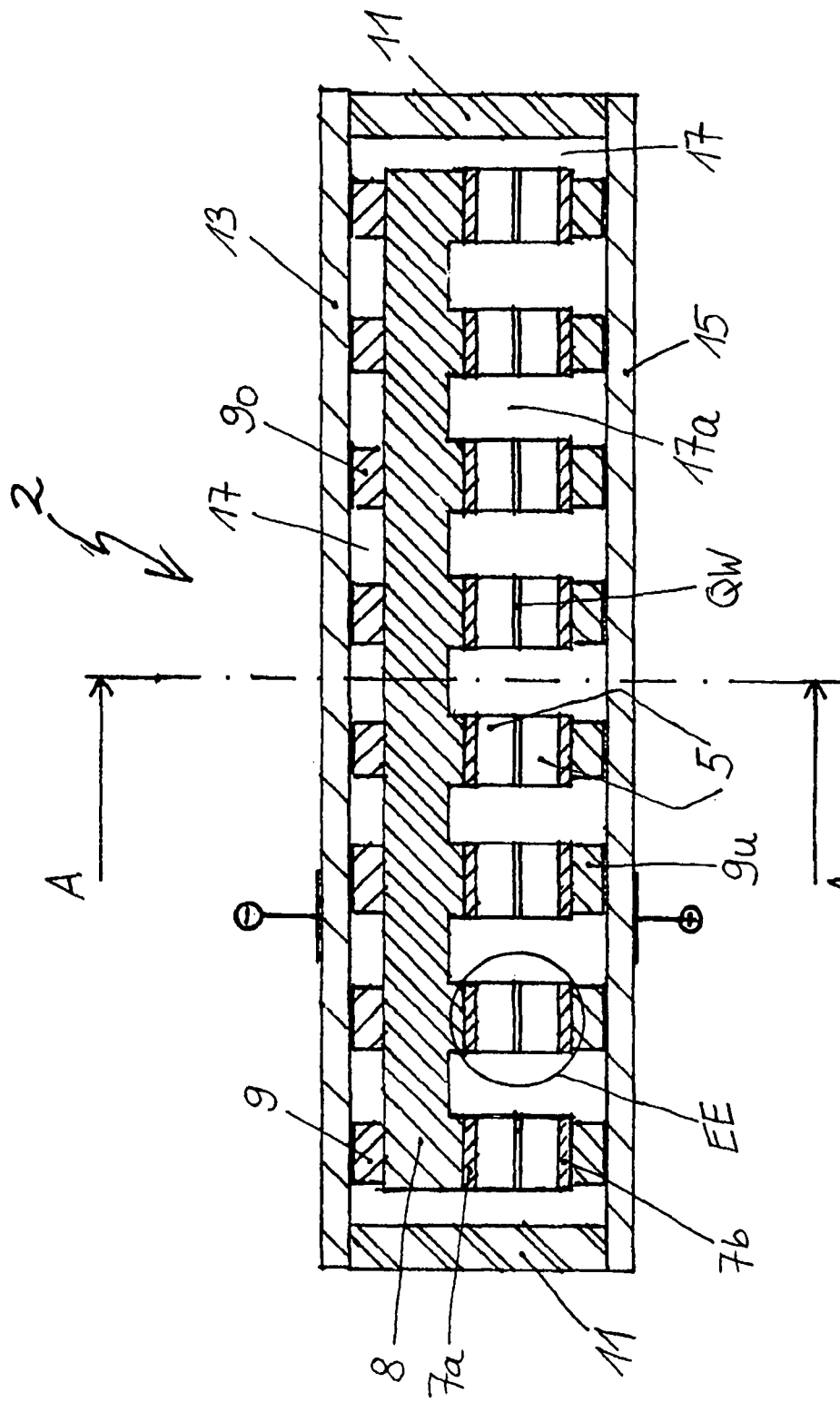
FIG. 1 shows a sectional view perpendicular to the optical axis of a laser diode according to the invention.

FIG. 1 shows a sectional view through a laser diode 2 according to the invention; in the case illustrated here, the laser diode comprises eight individual emitters EE. Said eight individual emitters are substantially made up of an n-type cladding 7a, two layers of a waveguide 5, a beam generator QW and a p-type cladding 7b. The waveguides 5 have the function to keep the laser beam in the beam generator QW by means of total internal reflection at the boundary surface to the beam generator QW. The beam generator QW is the actual active medium where the laser beam is produced. The individual emitters EE are disposed on a common substrate 8. The elements 8, 7a, 5, QW, 5 and 7b form a conventional individual emitter EE which in combination form a laser bar; for the sake of simplicity, only eight individual emitters are shown—in reality, laser bars with up to 50 or more individual emitters are assembled.

In operation, a laser beam would leave each of the eight individual emitters in the area referenced with QW, namely with reference to FIG. 1 perpendicular to the paper plane and toward the viewer.

First spacers 9o which are preferably made of gold rest on the upper side of the substrate 8. Second spacers 9u, which are also preferably made of gold, rest against the lower side of the p-type cladding 7b. The entire assembly is incorporated in a housing from which a first contact part 13, a second contact part 15 and two side pieces 11 can be seen in this view. As schematically shown in FIG. 1, the first contact part 13 serves as the negative electrode and the second contact part 15 serves as the positive electrode. The two side pieces 11 are made of an electrically insulating material. Thus, the first and second spacers 9o and 9u have a triple function: They serve as current-carrying elements and are disposed in the current flow from the positive electrode to the negative electrode. Secondly, they serve as retaining elements while they are fixed in the housing preferably by means of clamping forces only, so that there is no need of solder layers to attach them. Finally, the spacers 9o and 9u serve as cooling bodies.

Reference numerals 17 and 17a designate cavities and incisions, respectively, through which a cooling medium flows according to the invention. Said cooling medium may be a gas or a gas mixture, preferably air. The cavities 17 are situated between the upper spacers 9o and in the vicinity of the two side pieces 11. The incisions 17a are formed between the individual emitters EE substantially by micro incisions or micro milled areas, which are worked into a solid material during manufacturing the laser bar. The issue of how far these incisions EE extend into the substrate 8, is to be determined in the light of the cooling effect of the incisions 17a and the stability of the substrate 8.

Said incisions 17a as well as the cavities 17 define channels through which the cooling air is guided. According to FIG. 1, the flow direction of the cooling air is perpendicular to the drawing plane and points away from the viewer. Adjacent to the side pieces 11, FIG. 1 shows a cavity 17 in each case, having a cooling medium flowing through it. In theory, these cavities may also be omitted by placing the side pieces 11 directly against the end face of the substrate. For reasons of the cooling effect, however, it seems to be advisable to cool those areas, too. The upper and lower spacers 9o and 9u, respectively, are immediately surrounded by the flowing cooling medium. As said spacers 9o, 9u are preferably made of gold, any heat energy removed from the substrate 8 and the individual emitters EE is optimally discharged via the cooling medium.

In the following, the nature of the air flow for an intense, internal cooling of the laser diode 2 will be explained with reference to FIGS. 2 and 3.

Figures 2, 3:
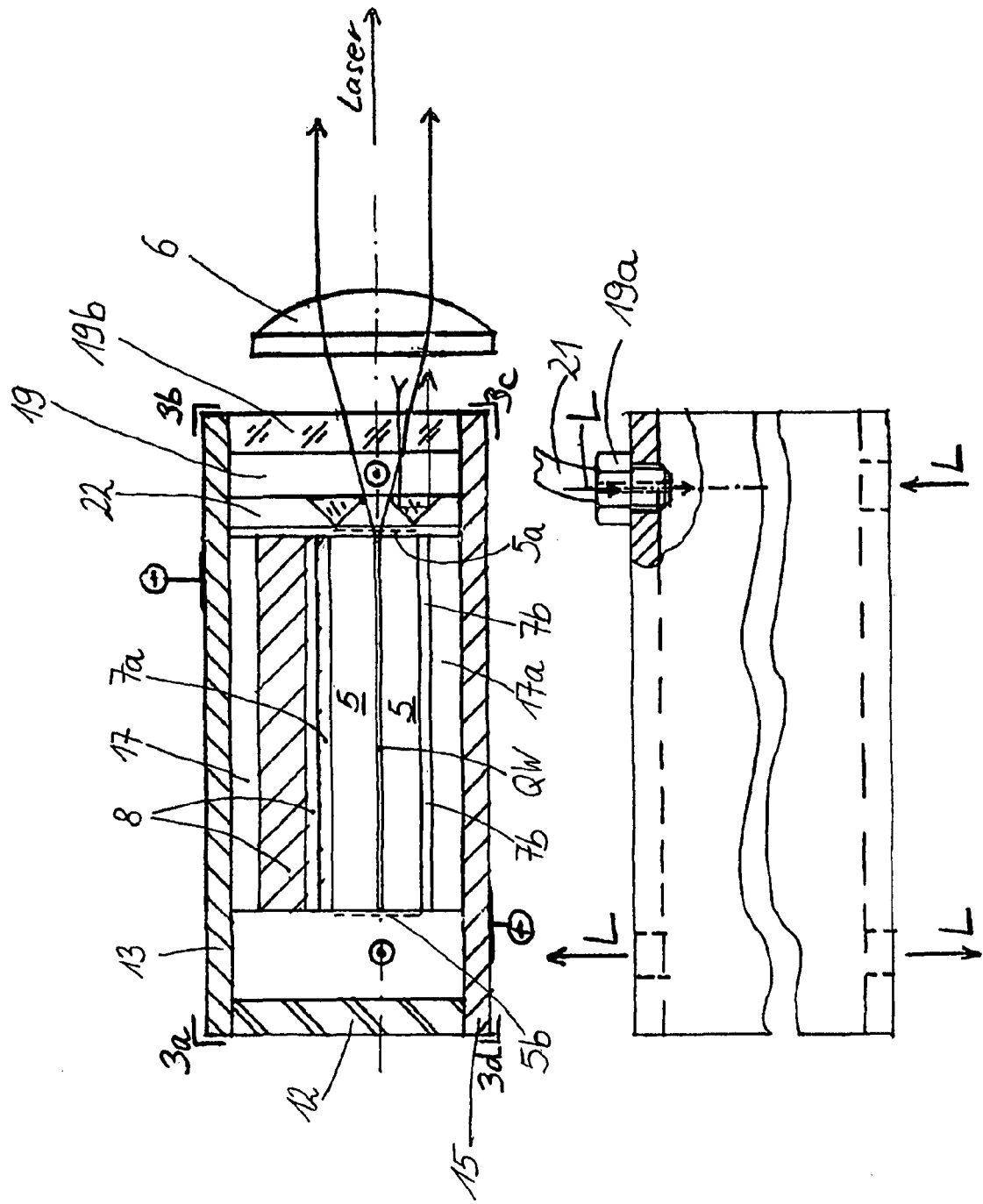
FIG. 2 shows a cross-section along line A-A of FIG. 1.
FIG. 3 shows a partial cross-section through the laser diode according to the invention in order to show the air guiding scheme in schematic fashion.

FIG. 2 shows a cross-section along line A-A of FIG. 1. The individual elements of the assembly according to the invention will be explained from top to bottom. One can see the first contact part 13 as well as a cavity 17 provided underneath it, followed by the substrate 8, and underneath the latter the elements 7a, 5, QW, 5 and 7b. A prismatic aperture element 22 is provided in the area of the beam outlet side of the beam generator QW, i.e. on the right side of the housing in FIG. 2. Further, an optical element 19b is provided which may be a plane-parallel plate or a lens. The optical element 19b which is shown here may also be realized in the form of one or more diffractive elements, a lens doublet, etc. A pressure build-up chamber 19 is arranged between the prismatic aperture element 22 and the optical element 19b. In addition, a backplate 12 is provided which consists of an electrically insulating material. The housing consisting of the first contact part 13, the second contact part 15, the optical element 19b, the backplate 12 and the two side pieces 11 is sealed so as to be air-tight and dust-proof.

Reference numerals 3a, 3b, 3c and 3d can be seen at the corners of the housing shown in FIG. 2. These reference numerals schematically represent mounts of the laser diode 2 according to the invention. The mounts 3a, 3b, 3c and 3d serve the purpose to reliably clamp the laser diode 2, and at the same time they establish an electrical insulation for it. The specific implementation of said mounts 3a-d is not relevant for the invention and thus will not be explained in more detail. Said mounts 3a-d may also serve the purpose to stack some of the laser bars shown in FIG. 2 one above the other, which would result in a laser stack.

The present invention also includes an assembly in which several of the laser bars shown in FIG. 1 are stacked one upon the other in a housing. In this case, two laser bars would be provided in a "back-to-back" arrangement in each case, i.e. in such a manner that the substrate sides face each other. Several of these paired assemblies consisting of two laser bars may be provided in a housing.

In an overall view of FIG. 2 with FIG. 3, a connecting piece 19a is to be seen to which a compressed air hose 21 is connected. Preferably, two connecting pieces 19a are provided according to FIG. 3 and are arranged so as to be diametrically opposed. A cooling medium, which is supplied via the two compressed air hoses which are attached to the connecting pieces, arrives at the pressure build-up chamber 19 in the form of two air jets (see the flow arrow L at the right side of FIG. 3). The cooling medium continues its flow through the cavities 17 and the incisions 17a, flows off at the left side of the housing as is schematically indicated by the left-hand flow arrows L and ensures an intense internal cooling of the laser diode 2.

FIG. 2 schematically shows an output mirror 5a and a rear mirror 5b on the laser diode 2. The laser beam leaving the output mirror 5a is emitted towards outside through the optical element 19b. Here, the beam may be sent through a lens 6, for example, and may be used for pumping a laser, for instance. The lens 6 may be any lens assembly such as a lens doublet, for instance. Lasers which can be pumped by means of the laser diode 2 according to the invention include e.g. fiber lasers, disc lasers, rod lasers, etc. A direct application of the laser diode 2 is also possible, i.e. a direct use of its output beam.

It can be taken from FIGS. 1 and 2 that the air exerts a cooling effect on inner surfaces of the laser diode 2 itself, instead of cooling a heat sink which absorbs the heat energy of a diode and removes it.

FIG. 4 shows the prismatic aperture element 22 of FIG. 2 in an isolated representation. The prismatic aperture element 22 has a recess 22a through which the cooling medium fed into the pressure build-up chamber can flow in order to arrive at the cavities 17 and the incisions 17a. The prismatic aperture element 22 also comprises diaphragm holes 22b in a number which equals the number of the individual emitters EE. The cooling medium flows through these diaphragm holes, too. Said diaphragm holes 22b act as a limitation for the laser beam; any laser radiation which arrives from outside, i.e. which is reflected by the work piece, for example, is blocked to a major extent by the material, of the prismatic aperture element 22, surrounding the diaphragm holes 22b and is discharged. The prismatic aperture element 22 is a prismatic element and has the purpose to protect the individual emitters EE and above all the waveguide 5 against any reflections from the work piece.

An essential advantage of the laser diode 2 according to the invention which can be expected is that a strong self-cleaning effect will be produced in particular in the area of the output mirror 5a, which is due to the streams of the cooling medium. A part of the stream flows through the diaphragm holes 22b and directly hits the area of the beam generator QW where the laser diode has its hottest point.

The drawings in the Figures do not reflect the real relative proportions of a laser diode and are illustrated in part with greatly exaggerated dimensions for the sake of a clearer presentation.

| List of reference numerals | |
|---|---|
| 2 | laser diode |
| 3a-d | mount |
| 5 | waveguide |
| 5a | output mirror |
| 5b | rear mirror |
| 6 | lens |
| 7a | n-type cladding |
| 7b | p-type cladding |
| 8 | substrate |
| 9o | first spacers |
| 9u | second spacers |
| 11 | side piece |
| 12 | backplate |
| 13 | first contact part |
| 15 | second contact part |
| 17 | cavity |
| 17a | incision |
| 19 | pressure build-up chamber |
| 19a | connecting piece |
| 19b | optical element |
| 21 | compressed air hose |
| 22 | prismatic aperture element |
| 22a | recess |
| 22b | panel hole |
| EE | individual emitter |
| L | flow arrow |
| QW | beam generator |

The invention claimed is:

1. A laser diode (2) comprising a plurality of individual emitters (EE) which are constructed on a substrate (8) and each EE comprises an output mirror (5a) and a rear mirror (5b), the laser diode (2) comprising a housing which consists of a first contact part (13), a second contact part (15), an optical element (19b), a backplate (12) and two side pieces (11), a plurality of first spacers (9o) being arranged between the substrate (8) and the first contact part (13) and a plurality of second spacers (9u) being arranged between the individual emitters (EE) and the second contact part (15),
    characterized in that
    incisions (17a) are formed between the respective individual emitters (EE), a cooling medium flowing through said incisions, and
    a prismatic aperture element (22) is arranged in the area of the output mirror (5a) of the individual emitters (EE).

2. The laser diode (2) according to claim 1, characterized in that the first spacers (9o) are made of an electrically conductive material.

3. The laser diode (2) according to claim 1, characterized in that adjacent first spacers (9o) form a cavity (17) in each case.

4. The laser diode (2) according to claim 1, characterized in that the individual emitters (EE) comprise an n-type cladding (7a) which is in contact with the substrate (8).

5. The laser diode (2) claim 1, characterized in that the individual emitters (EE) comprise a p-type cladding (7b) which is in contact with the second spacers (9u).

6. The laser diode (2) claim 1, characterized in that the second spacers (9u) are made of an electrically conductive material.

7. The laser diode (2) claim 1, characterized in that a cooling medium flows through the cavities (17).

8. The laser diode (2) claim 1, characterized in that two side pieces (11) made of an electrically insulating material are arranged between the first contact part (13) and the second contact part (15).

9. The laser diode (2) claim 1, characterized in that an insulating backplate (12) and an optical element (19b) are arranged between the first contact part (13) and the second contact part (15).

10. The laser diode (2) claim 1, characterized in that a pressure build-up chamber (19) is provided between the prismatic aperture element (22) and the optical element (19b).

11. The laser diode (2) claim 1, characterized in that the first spacers (9o) and/or the second spacers (9u) are clamped in the housing without any soldering layer and exclusively by means of a clamping force.

12. The laser diode (2) claim 1, characterized in that the cooling medium has a high flow speed at least in the area of the output mirror (5a).

13. A device for generating a laser beam, comprising a laser diode (2) according to claim 1.

* * * * *